(12) United States Patent
Joo

(10) Patent No.: US 11,056,596 B2
(45) Date of Patent: Jul. 6, 2021

(54) SEMICONDUCTOR DEVICE AND METHOD OF MANUFACTURING THE SAME

(71) Applicants: HYUNDAI MOTOR COMPANY, Seoul (KR); KIA MOTORS CORPORATION, Seoul (KR)

(72) Inventor: NackYong Joo, Hanam-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 0 days.

(21) Appl. No.: 16/381,361

(22) Filed: Apr. 11, 2019

(65) Prior Publication Data

US 2020/0185540 A1 Jun. 11, 2020

(30) Foreign Application Priority Data

Dec. 5, 2018 (KR) ........................ 10-2018-0154984

(51) Int. Cl.
| | |
|---|---|
| *H01L 29/872* | (2006.01) |
| *H01L 29/16* | (2006.01) |
| *H01L 21/265* | (2006.01) |
| *H01L 29/66* | (2006.01) |
| *H01L 21/02* | (2006.01) |
| *H01L 29/165* | (2006.01) |

(52) U.S. Cl.
CPC ...... *H01L 29/872* (2013.01); *H01L 21/02532* (2013.01); *H01L 21/26513* (2013.01); *H01L 29/165* (2013.01); *H01L 29/1608* (2013.01); *H01L 29/66143* (2013.01)

(58) Field of Classification Search
CPC ............. H01L 29/872; H01L 21/02532; H01L 21/26513; H01L 29/1608; H01L 29/165; H01L 29/66143
See application file for complete search history.

(56) References Cited

U.S. PATENT DOCUMENTS

| | | | | |
|---|---|---|---|---|
| 5,475,257 | A * | 12/1995 | Hashimoto | ....... H01L 29/41708 257/587 |
| 2002/0017647 | A1* | 2/2002 | Bakowski | ............. H01L 29/417 257/77 |
| 2014/0117376 | A1* | 5/2014 | Terano | .................... H01L 24/05 257/76 |
| 2015/0115285 | A1* | 4/2015 | Kinoshita | ........... H01L 29/7839 |

OTHER PUBLICATIONS

Hayashi, T. et al., "New High-Voltage Unipolar Mode p+ Si/n-4H-SiC Heterojunction Diode," Materials Science Forum, vol. 483-485, pp. 953-956, 2005.

* cited by examiner

*Primary Examiner* — Zandra V Smith
*Assistant Examiner* — Andre C Stevenson
(74) *Attorney, Agent, or Firm* — McDonnell Boehnen Hulbert & Berghoff LLP

(57) ABSTRACT

A semiconductor device according to an exemplary embodiment of the present disclosure includes: an n− type layer disposed in a first surface of a substrate; an n type layer disposed on the n− type layer; a first electrode disposed on the n type layer, and a second electrode disposed in a second surface of the substrate, wherein an energy band gap of the n− type layer is larger than an energy band gap of the n type layer.

9 Claims, 4 Drawing Sheets

SEMICONDUCTOR DEVICE AND METHOD OF MANUFACTURING THE SAME

CROSS REFERENCE TO RELATED APPLICATION

This application claims priority to and the benefit of Korean Patent Application No. 10-2018-0154984 filed in the Korean Intellectual Property Office on Dec. 5, 2018, the entire contents of which are incorporated herein by reference.

BACKGROUND

(a) Technical Field

The present disclosure relates to a semiconductor device and a manufacturing method thereof.

(b) Description of the Related Art

With the recent trend toward large-sized and large-capacity application apparatuses, a power semiconductor device having a high breakdown voltage, a high current capacity, and high-speed switching characteristics has become necessary.

A diode is a two-terminal device capable of conducting a current in one direction, and a diode for a power semiconductor device for switching requires high voltage and large current. These diode devices have different electrical characteristics depending on the structure, and appropriate devices are used according to the application field. However, a high current density, a low turn-on voltage, a high breakdown voltage, a low leakage current, and a fast switching speed are commonly required.

The above information disclosed in this Background section is only for enhancement of understanding of the background of the invention and therefore it may contain information that does not form the prior art that is already known in this country to a person of ordinary skill in the art.

SUMMARY

The present disclosure relates to a semiconductor device with high current density and a low turn-on voltage.

A semiconductor device according to an exemplary embodiment of the present disclosure includes: an n− type layer disposed in a first surface of a substrate; an n type layer disposed on the n− type layer; a first electrode disposed on the n type layer, and a second electrode disposed in a second surface of the substrate, wherein an energy band gap of the n− type layer is larger than the energy band gap of the n type layer.

A Schottky junction may be formed in a contacting surface of the first electrode and the n type layer.

An ion doping concentration of the n− type layer may be smaller than an ion doping concentration of the n type layer.

A heterojunction may be formed in the contacting surface of the n− type layer and the n type layer.

The n− type layer may include silicon carbide, and the n type layer may include silicon.

The semiconductor device according to an exemplary embodiment of the present disclosure may further include a low concentration silicon n type layer disposed between the n− type layer and the n type layer, and the ion doping concentration of the low concentration silicon n type layer may be smaller than the ion doping concentration of the n− type layer.

A heterojunction may be formed in the contacting surface of the n− type layer and the low concentration silicon n type layer.

The n− type layer may include silicon carbide, and the n type layer and the low concentration silicon n type layer may include silicon.

The semiconductor device according to an exemplary embodiment of the present disclosure may further include a low concentration silicon carbide n type layer disposed between the n− type layer and the n type layer, and the ion doping concentration of the low concentration silicon n type layer may be smaller than the ion doping concentration of the n− type layer.

The heterojunction may be formed in the contacting surface of the n type layer and the low concentration silicon carbide n type layer.

The n− type layer and the low concentration silicon carbide n type layer may include silicon carbide, and the low concentration silicon n type layer may include silicon.

The substrate may be an n+ type silicon carbide substrate.

A manufacturing method of a semiconductor device according to an exemplary embodiment of the present disclosure includes: forming an n− type layer in a first surface of a substrate; forming an n type layer on the n− type layer; forming a first electrode on the n type layer; and forming a second electrode in a second surface of the substrate, wherein an energy band gap of the n− type layer is larger than the energy band gap of the n type layer.

The n type layer may be formed by an epitaxial growth on the n− type layer.

The forming of the n type layer may include forming a silicon n− type layer by the epitaxial growth on the n− type layer; and implanting an n type ion on the silicon n− type layer, where the silicon n− type layer may include the silicon.

According to an exemplary embodiment of the present disclosure, the semiconductor device may have high current density and a low turn-on voltage.

DETAILED DESCRIPTION OF THE EMBODIMENTS

Figure 1:
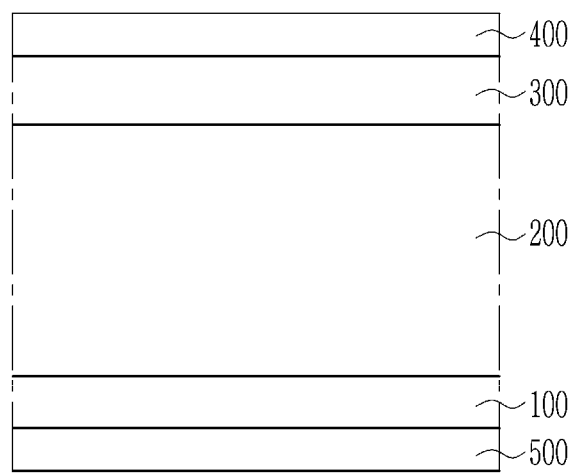
FIG. 1 is a cross-sectional view schematically showing an example of a semiconductor device according to an exemplary embodiment of the present disclosure.

Hereinafter, exemplary embodiments of the present disclosure will be described in detail with reference to the accompanying drawings. As those skilled in the art would realize, the described embodiments may be modified in various different ways, all without departing from the spirit or scope of the present disclosure. On the contrary, exemplary embodiments introduced herein are provided to make disclosed contents thorough and complete, and to sufficiently transfer the spirit of the present disclosure to those skilled in the art.

In the drawings, the thickness of layers, films, panels, regions, etc., are exaggerated for clarity. It will be understood that when a layer is referred to as being "on" another layer or substrate, it can be directly on the other layer or substrate, or another layer intervening them may also be present.

FIG. 1 is a cross-sectional view schematically showing an example of a semiconductor device according to an exemplary embodiment of the present disclosure.

Referring to FIG. 1, the semiconductor device according to the present exemplary embodiment includes a substrate 100, an n− type layer 200, an n type layer 300, a first electrode 400, and a second electrode 500.

The semiconductor device according to the present exemplary embodiment may be a diode. In this case, the first electrode 400 may be an anode, and the second electrode 500 may be a cathode.

The substrate 100 may be an n+ type silicon carbide (SiC) substrate.

The n− type layer 200 is disposed in the first surface of the substrate 100, and the n type layer 300 is disposed on the n− type layer 200. An energy band gap of the n− type layer 200 is larger than the energy band gap of the n type layer 300. Here, the n− type layer 200 may include silicon carbide, and the n type layer 300 may include silicon (Si). The contacting surface of the n− type layer 200 and the n type layer 300 form a heterojunction.

Also, an ion doping concentration of the n type layer 300 is larger than an ion doping concentration of the n− type layer 200.

On the other hand, in the present exemplary embodiment, the substrate 100 and the n− type layer 200 include the silicon carbide and the n type layer 300 includes silicon (Si), however it is not limited thereto, and a material having a relatively large energy band gap for the n− type layer 200 and a relatively small energy band gap for the n type layer 300 may be included. For example, the substrate 100 and the n− type layer 200 may include gallium oxide ($Ga_2O_3$), and the n type layer 300 may include one among germanium (Ge), silicon, gallium nitride (GaN), silicon carbide, and aluminum nitride (AlN).

The first electrode 400 is disposed on the n type layer 300 and may include a Schottky metal. The first electrode 400 is in contact with the n type layer 300, thereby forming the Schottky junction in the boundary surface therebetween.

The second electrode 500 is disposed in the second surface of the substrate 100 and may include an ohmic metal. Here, the second surface of the substrate 100 indicates a surface opposite to the first surface of the substrate 100.

In the semiconductor device according to the present exemplary embodiment, as the n type layer 300 having the smaller energy band gap than that of the n− type layer 200 is disposed on the n− type layer 200, the turn-on of the semiconductor device is generated in the Schottky junction surface that is the contacting surface of the n type layer 300 and the first electrode 400. In addition, a maximum electric field causing a breakdown of the semiconductor device is formed at the heterojunction surface, which is the contacting surface of the n− type layer 200 and the n type layer 300. Accordingly, the current density of the semiconductor device may be improved and a turn-on voltage may be reduced.

Next, the operation of the semiconductor device according to the present exemplary embodiment is described in detail with reference to FIG. 2 and FIG. 3.

Figure 2:
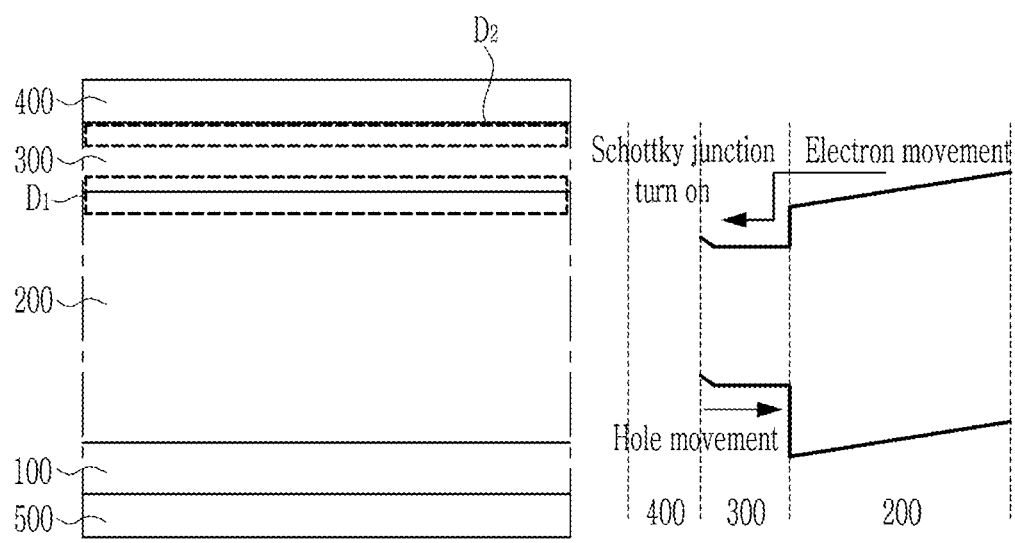
FIG. 2 is a view showing a depletion layer distribution and an energy band diagram of an on state of a semiconductor device according to FIG. 1.

FIG. 2 is a view showing a depletion layer distribution and an energy band diagram of an on state of a semiconductor device according to FIG. 1. FIG. 3 is a view showing a depletion layer distribution and an energy band diagram of an off state of a semiconductor device according to FIG. 1.

Referring to FIG. 2, in the on state of the semiconductor device, depletion layers D1 and D2 are formed near the contacting surface of the n− type layer 200 and the n type layer 300 and below the contacting surface of the n type layer 300 and the first electrode 400.

In the on state of the semiconductor device, a positive (+) voltage is applied to the first electrode 400 that is the anode of the semiconductor device.

In this case, the turn-on is generated in the Schottky junction surface which is the contacting surface of the n type layer 300 and the first electrode 400, and electrons of the n− type layer 200 move to the n type layer 300 without disturbance of an energy barrier. Also, holes of then type layer 300 do not move to the n− type layer 200 by the energy barrier in the heterojunction surface that is the contacting surface of the n− type layer 200 and the n type layer 300.

Thus, since the entire current is formed only by the movement of electrons, it is possible to realize a fast switching speed. In addition, since the turn-on occurs at the Schottky junction surface, the turn-on may be possible at low voltage.

Figure 3:
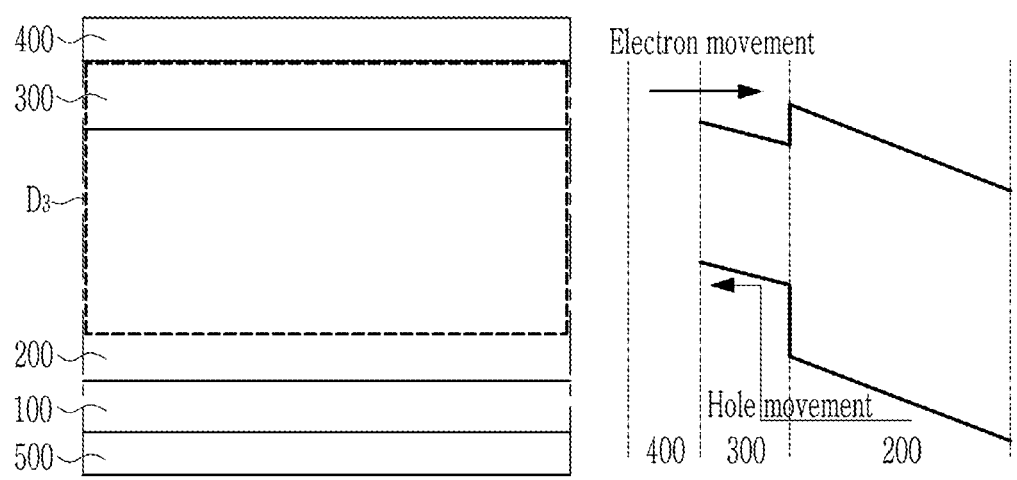
FIG. 3 is a view showing a depletion layer distribution and an energy band diagram of an off state of a semiconductor device according to FIG. 1.

Referring to FIG. 3, in the off state of the semiconductor device, the depletion layer D3 is formed in the region except for the part of the n− type layer 200 and the n type layer 300.

In the off state of the semiconductor device, the positive (+) voltage is applied to the second electrode 500 that is the cathode of the semiconductor device.

In this case, a large voltage drop is generated in the n− type layer 200 having the lower ion doping concentration than the ion doping concentration of the n type layer 300, and the electrons of the n type layer 300 do not move to the n− type layer 200 by the energy barrier in the heterojunction surface that is the contacting surface of the n− type layer 200 and the n type layer 300. Also, the holes of the n type layer 300 move to the n type layer 300 without the disturbance of the energy barrier. At this time, the number of holes existing in the n− type layer 200 is very small, and thus the off state in which the current hardly flows is maintained. In the off state of the semiconductor device, most of the voltage is applied to the n− type layer 200, so that a high breakdown voltage may be realized.

Next, a characteristic of the semiconductor device according to the present exemplary embodiment and a general semiconductor device is compared and described with reference to Table 1.

Table 1 shows an operation simulation result of the semiconductor device according to the present exemplary embodiment and a general semiconductor device.

Comparative Example 1 is a typical heterojunction diode (HDJ) device, and a Comparative Example 2 is a typical Schottky barrier diode (SBD) device.

Table 1 compares the characteristics of the semiconductor devices by making the breakdown voltages of the semiconductor devices according to the exemplary embodiment, Comparative Example 1, and Comparative Example 2 almost the same.

TABLE 1

|  | Comparative Example 1 | Comparative Example 2 | Exemplary embodiment |
|---|---|---|---|
| Current density (A/cm$^2$) | 97.25 | 51.73 | 308.64 |
| Turn-on voltage (V) | 1.08 | 0.54 | 0.2 |
| Breakdown voltage (V) | 3225 | 3244 | 3231 |
| Device area (cm$^2$) of 100 A | 1.028 | 1.933 | 0.324 |

Referring to Table 1, in the case of the semiconductor device according to the present exemplary embodiment compared with the diode device according to Comparative Example 1, it may be confirmed that the current density is increased by about 217.4% and the turn-on voltage is reduced by about 81.5%. In the case of the semiconductor device according to the present exemplary embodiment compared with the diode device according to Comparative Example 2, it may be confirmed that the current density is increased by about 496.6% and the turn-on voltage is reduced by about 62.9%.

Also, in the case of the semiconductor device according to the present exemplary embodiment, it may be confirmed that the device area is reduced by about 68.5% compared with the diode device according to Comparative Example 1, and is reduced by about 83.2% compared with the diode device according to Comparative Example 2. Accordingly, for the semiconductor device according to the present exemplary embodiment, a cost reduction of the semiconductor device is possible through increasing the number of semiconductor devices per unit wafer and a yield improvement.

Next, a manufacturing method of the semiconductor device according to an exemplary embodiment of the present disclosure is described with reference to FIG. 4 and FIG. 1.

Figure 4:
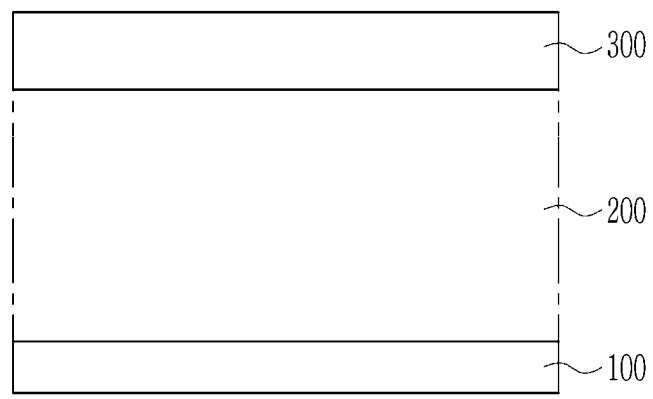
FIG. 4 is a view schematically showing an example of a manufacturing method of a semiconductor device according to an exemplary embodiment of the present disclosure.

FIG. 4 is a view schematically showing an example of a manufacturing method of a semiconductor device according to an exemplary embodiment of the present disclosure.

Referring to FIG. 4, the substrate 100 is prepared, and the n− type layer 200 and the n type layer 300 are sequentially formed in the first surface of the substrate 100. Here, the substrate 100 may be the n+ type silicon carbide substrate. The n− type layer 200 may be formed on the substrate 100 by epitaxial growth, and the n type layer 300 may be formed on the substrate 100 by epitaxial growth on the n− type layer 200. The n− type layer 200 may include silicon carbide, and the n type layer 300 may include silicon (Si).

Referring to FIG. 1, the first electrode 400 is formed on the n type layer 300, and the second electrode 500 is formed in the second surface of the substrate 100. Here, the first electrode 400 is in contact with the n type layer 300, thereby forming the Schottky junction in the contacting surface thereof. The first electrode 400 may include the Schottky metal, and the second electrode 500 may include the ohmic metal.

On the other hand, the n type layer 300 may be formed by epitaxial growth and ion injection. This is described with reference to FIG. 5 and FIG. 6.

Figure 5:
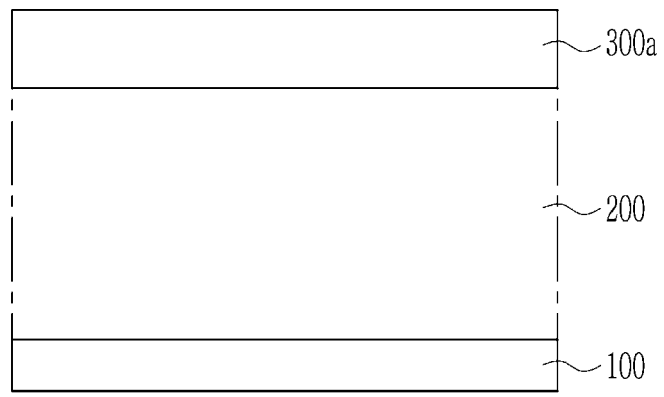
FIG. 5 and FIG. 6 are views schematically showing an example of a manufacturing method of a semiconductor device according to another exemplary embodiment of the present disclosure.
Figure 6:
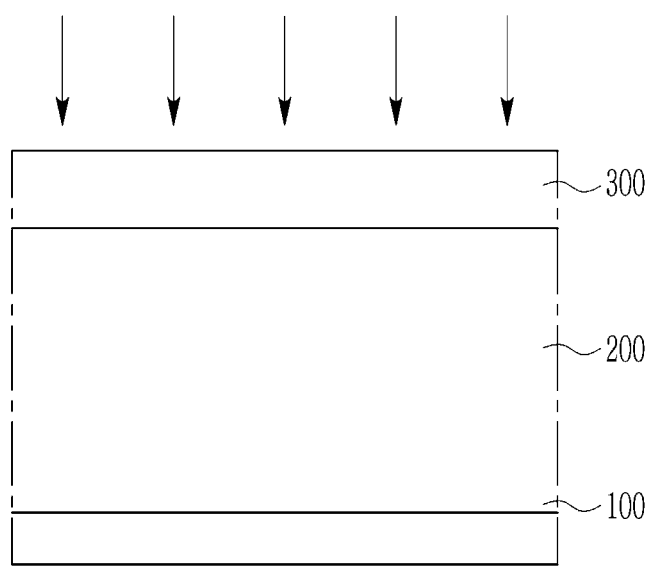

FIG. 5 and FIG. 6 are views schematically showing an example of a manufacturing method of a semiconductor device according to another exemplary embodiment of the present disclosure.

Referring to FIG. 5, the substrate 100 is prepared, and the n− type layer 200 and an n− type layer 300a are sequentially formed in the first surface of the substrate 100. Here, the substrate 100 may be the n+ type silicon carbide substrate. The n− type layer 200 may be formed on the substrate 100 by epitaxial growth, and the n− type layer 300 may be formed on the substrate 100 by epitaxial growth on the n− type layer 200. The n− type layer 200 may include the silicon carbide, and the silicon n− type layer 300a may include silicon (Si).

Referring to FIG. 6, the n type layer 300 is formed by implanting n type ions such as nitrogen (N), phosphorous (P), arsenic (As), and antimony (Sb) into the silicon n− type layer 300a.

The semiconductor device according to another exemplary embodiment of the present disclosure is described with reference to FIG. 7 and FIG. 8.

Figure 7:
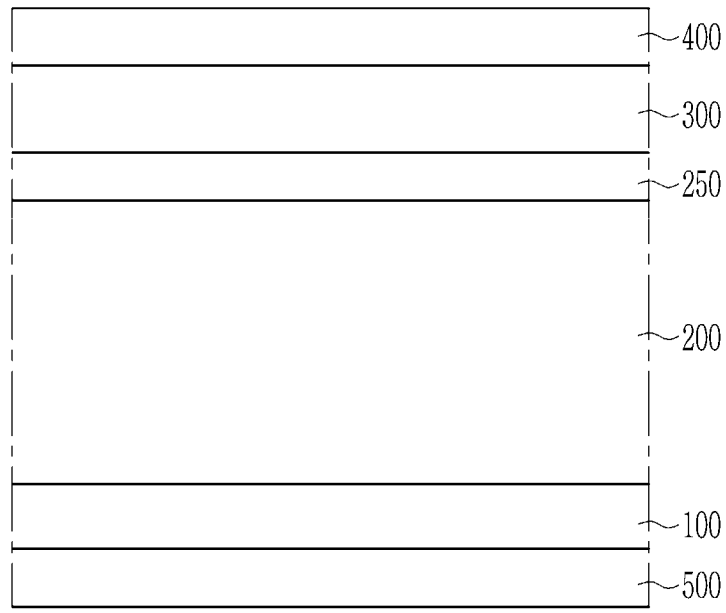
FIG. 7 and FIG. 8 are a cross-sectional view schematically showing an example of a semiconductor device according to another exemplary embodiment of the present disclosure.
Figure 8:
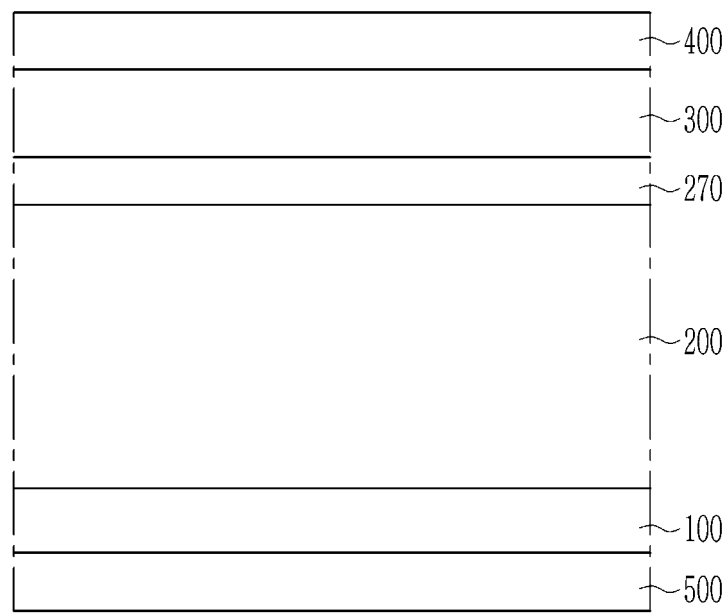

FIG. 7 and FIG. 8 are a cross-sectional view schematically showing an example of a semiconductor device according to another exemplary embodiment of the present disclosure.

Referring to FIG. 7, the semiconductor device according to the present exemplary embodiment is the same as the remaining structure of the semiconductor device according to FIG. 1, except for adding a low concentration silicon n type layer 250. Therefore, the description of the same structures is omitted.

The low concentration silicon n type layer 250 is disposed between the n− type layer 200 and the n type layer 300. The ion doping concentration of the low concentration silicon n type layer 250 is smaller than the ion doping concentration of the n− type layer 200 and the ion doping concentration of the n type layer 300. The low concentration silicon n type layer 250 includes silicon. In the semiconductor device according to the present exemplary embodiment, differently from the semiconductor device according to FIG. 1, the heterojunction is formed in the contacting surface of the low concentration silicon n type layer 250 and the n− type layer 200.

Referring to FIG. 8, the semiconductor device according to the present exemplary embodiment is the same as the remaining structure of the semiconductor device according to FIG. 1, except for adding a low concentration silicon carbide n type layer 270. Therefore, the description of the same structure is omitted.

The low concentration silicon carbide n type layer 270 is disposed between the n− type layer 200 and the n type layer 300. The ion doping concentration of the low concentration silicon carbide n type layer 270 is smaller than the ion doping concentration of the n− type layer 200 and the ion doping concentration of then type layer 300. The low concentration silicon carbide n type layer 270 includes silicon carbide. In the semiconductor device according to the present exemplary embodiment, differently from the semiconductor device according to FIG. 1, the heterojunction is formed in the contacting surface of the low concentration silicon carbide n type layer 270 and the n type layer 300.

In the semiconductor device according to FIG. 7 and FIG. 8, compared with the semiconductor device according to FIG. 1, the low concentration silicon n type layer 250 and the low concentration silicon carbide n type layer 270 are added, thereby increasing the breakdown voltage compared with the semiconductor device according to FIG. 1.

While a number of exemplary aspects have been discussed above, those of skill in the art will recognize that still further modifications, permutations, additions and sub-combinations thereof of the disclosed features are still possible. It is therefore intended that the following appended claims and claims hereafter introduced are interpreted to include all

The invention claimed is:

1. A semiconductor device comprising:
   an n− type layer disposed in a first surface of a substrate;
   an n type layer disposed on the n− type layer, wherein the n type layer and the substrate are different layers;
   a first electrode disposed on the n type layer;
   a second electrode disposed in a second surface of the substrate; and
   a low concentration silicon n type layer disposed between the n− type layer and the n type layer;
   wherein an energy band gap of the n− type layer is larger than the energy band gap of the n type layer;
   wherein a Schottky junction is formed in a contacting surface of the first electrode and the n type layer;
   wherein an ion doping concentration of the n− type layer is smaller than an ion doping concentration of the n type layer; and
   wherein the ion doping concentration of the low concentration silicon n type layer is smaller than the ion doping concentration of the n− type layer.

2. The semiconductor device of claim 1, wherein a heterojunction is formed in the contacting surface of the n− type layer and the low concentration silicon n type layer.

3. The semiconductor device of claim 2, wherein the n− type layer includes silicon carbide, and the n type layer and the low concentration silicon n type layer include silicon.

4. A semiconductor device comprising:
   an n− type layer disposed in a first surface of a substrate;
   an n type layer disposed on the n− type layer, wherein the n type layer and the substrate are different layers;
   a first electrode disposed on the n type layer;
   a second electrode disposed in a second surface of the substrate; and
   a low concentration silicon carbide n type layer disposed between the n− type layer and the n type layer; and
   wherein a Schottky junction is formed in a contacting surface of the first electrode and the n type layer;
   wherein an ion doping concentration of the n− type layer is smaller than an ion doping concentration of the n type layer; and
   wherein the ion doping concentration of the low concentration silicon carbide n type layer is smaller than the ion doping concentration of the n− type layer.

5. The semiconductor device of claim 4, wherein the heterojunction is formed in the contacting surface of the n type layer and the low concentration silicon carbide n type layer.

6. The semiconductor device of claim 5, wherein the n− type layer and the low concentration silicon carbide n type layer include silicon carbide, and the n type layer includes silicon.

7. The semiconductor device of claim 1, wherein the substrate is an n+ type silicon carbide substrate.

8. A method for manufacturing a semiconductor device comprising:
   forming an n− type layer in a first surface of a substrate;
   forming an n type layer on the n− type layer, wherein the n type layer and the substrate are different layers;
   forming a first electrode on the n type layer; and
   forming a second electrode in a second surface of the substrate;
   wherein an energy band gap of the n− type layer is larger than the energy band gap of the n type layer;
   wherein a Schottky junction is formed in a contacting surface of the first electrode and the n type layer;
   wherein an ion doping concentration of the n− type layer is smaller than an ion doping concentration of the n type layer;
   wherein the n− type layer includes silicon carbide, and the n type layer includes silicon; and
   wherein the forming of the n type layer includes:
      forming a silicon n− type layer by epitaxial growth on the n− type layer; and
      implanting an n type ion on the silicon n− type layer; and
      the silicon n− type layer includes silicon.

9. The method of claim 8, wherein the substrate is an n+ type silicon carbide substrate.

* * * * *